(12) United States Patent
Kuo

(10) Patent No.: US 6,675,885 B2
(45) Date of Patent: Jan. 13, 2004

(54) HEAT-DISSIPATING DEVICE FOR ELECTRONIC COMPONENTS

(76) Inventor: Ching-Sung Kuo, No. 38, Lane 111, Nan-Tien-Mu Rd., Tu-Cheng City, Taipei Hsien (TW)

(*) Notice: Subject to any disclaimer, the term of this patent is extended or adjusted under 35 U.S.C. 154(b) by 25 days.

(21) Appl. No.: 09/834,066

(22) Filed: Apr. 12, 2001

(65) Prior Publication Data

US 2002/0148603 A1 Oct. 17, 2002

(51) Int. Cl.[7] ................................................. F28F 7/00
(52) U.S. Cl. ..................... 165/185; 165/80.3; 174/16.3; 257/722; 361/704
(58) Field of Search ................................ 165/80.3, 185; 257/722; 361/704, 707, 709, 697, 710; 174/16.3

(56) References Cited

U.S. PATENT DOCUMENTS

| | | | |
|---|---|---|---|
| 3,095,037 A | | 6/1963 | Bohm ............................ 165/47 |
| 4,434,844 A | * | 3/1984 | Sakitani et al. ............... 165/151 |
| 4,918,571 A | * | 4/1990 | Grabbe ........................ 361/386 |
| 5,521,439 A | * | 5/1996 | Casati et al. ................. 257/718 |
| 5,675,183 A | * | 10/1997 | Swamy et al. ............... 257/723 |
| 6,005,772 A | * | 12/1999 | Terao et al. .................. 361/699 |
| D426,195 S | * | 6/2000 | Kuo .......................... D13/179 |
| D426,196 S | * | 6/2000 | Lee ........................... D13/179 |
| D426,814 S | * | 6/2000 | Lee ........................... D13/179 |
| 6,289,975 B2 | * | 9/2001 | Kuo ........................... 165/80.3 |
| 6,295,202 B1 | * | 9/2001 | Tucker et al. ................ 361/704 |
| 6,301,779 B1 | * | 10/2001 | Azar .......................... 29/890.03 |
| 6,308,771 B1 | * | 10/2001 | Tavassoli ..................... 165/80.3 |
| 6,390,181 B1 | * | 5/2002 | Hall et al. ................... 165/80.3 |
| D458,232 S | * | 6/2002 | Lee ........................... D13/179 |
| 6,397,926 B1 | * | 6/2002 | Sato et al. ................... 165/80.3 |
| D467,559 S | * | 12/2002 | Lee ........................... D13/179 |
| 6,533,028 B2 | * | 3/2003 | Sato ........................... 165/80.3 |
| 6,585,925 B2 | * | 7/2003 | Benefield ..................... 264/255 |
| 2001/0010264 A1 | * | 8/2001 | Kuo ........................... 165/185 |
| 2002/0131236 A1 | * | 9/2002 | Lin ............................. 361/709 |
| 2002/0195229 A1 | * | 12/2002 | Hsich et al. ................. 165/80.3 |

FOREIGN PATENT DOCUMENTS

SU 1714724 A1 2/1992

* cited by examiner

Primary Examiner—Henry Bennett
Assistant Examiner—Nihir Patel
(74) Attorney, Agent, or Firm—Trop, Pruner & Hu, P.C.

(57) ABSTRACT

A heat dissipating device includes a plurality of plates each having a three-sided base plate portion and a pair of fin plate portions. The base plate portion has a contact side adapted to contact a heat generating object, and two opposite sides forming an angle therebetween and extending to two opposite ends of the contact side. The base plate portions of the plates are disposed in parallel and next to each other to form a stack. The fin plate portions respectively extend outward from the opposite sides of the base plate portions and are bent from the base plate portions to diverge outward and to form air passages therebetween. The heat dissipating device provides a high ratio of the area of the base plate portions to the area of the fin plate portions so that the stack is compact while the fin plate portions maintain a sufficient heat transfer surface area.

5 Claims, 3 Drawing Sheets

HEAT-DISSIPATING DEVICE FOR ELECTRONIC COMPONENTS

BACKGROUND OF THE INVENTION

1. Field of the Invention

The invention relates to a heat dissipating device for electronic components, more particularly to a heat dissipating device constituted by a plurality of metal plates which are disposed next to each other to form a stack.

2. Description of the Related Art

Heat-dissipating devices fabricated from aluminum extruded plate sections are commonly used in cooling electronic components, such as integrated circuit modules, since the manufacturing process thereof is simple and inexpensive. A typical heat-dissipating device has a plurality of thin metal plates with base plate portions arranged in a stack and coupled together by welding, screwing or riveting. Cooling fin portions extend in parallel from the base plate portions and are spaced apart from each other to define gaps for passage of an air flow. The base plate portions are adapted to contact a heat generating device to carry off heat by heat-conduction, whereas the fin portions serve to provide a heat transfer surface area to transfer heat to a cooling air flow by heat convection. The cooling efficiency of such heat dissipating devices depends on the heat transfer surface area, the orientation and the degree of separation of the fin plate portions. Generally, the ratio of the area of the fin plate portions to the area of the base plate portion in each plate is kept to be high in order to obtain a sufficient heat transfer area. The separation of the fin plate portions is arranged to be as large as possible so as to permit a substantial amount of air to flow therethrough.

In a copending U.S. patent application Ser. No. 09/379,069 and filed by the applicant of this application, there is disclosed a heat dissipating device in which fin plate portions extend divergingly from a stack of base plate portions to increase the measure of separation between the fin plate portions and to permit a sufficient amount of air to flow through the surface of the fin plate portions. The base plate portions are polygonal and include four sides or six sides. The fin plate portions extend from the base plate portions from one side or more than one side of the latter and have a large surface area as compared to the base plate portions. Although the heat dissipating devices disclosed in the aforesaid copending application can provide an efficient heat transfer due to the divergent separation and the increased heat transfer surface area of the fin portions, the four-sided or six-sided base plate portions can form a bulky body when arranged in a stack. In view of a recent trend toward miniaturization of electronic components, a heat-dissipating device which has a compact size but is still efficient for dissipating heat is desirable.

SUMMARY OF THE INVENTION

A primary object of the present invention is to provide a heat dissipating device of the above-mentioned type which has a high ratio of the area of fin plate portions to the area of base plate portions so that a stack part formed by the base plate portions is compact while the fin plate portions maintain a sufficient heat transfer surface area.

Another object of the present invention is to provide a heat dissipating device with a stack of base plate portions which has a reduced size but can still provide a sufficient contact surface to contact a heat generating object.

Accordingly, a heat dissipating device of the present invention comprises a plurality of plates each having a three-sided base plate portion and a pair of fin plate portions. The base plate portion has a contact side adapted to contact a heat generating object, and two opposite sides forming an angle therebetween and extending to two opposite ends of the contact side. The base plate portions of the plates are disposed in parallel and next to each other to form a stack. The fin plate portions of each plate respectively extend outward from the opposite sides of the base plate portion. The fin plate portions of the plates are bent respectively from the base plate portions of the plates to diverge outward and to form air passages therebetween.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
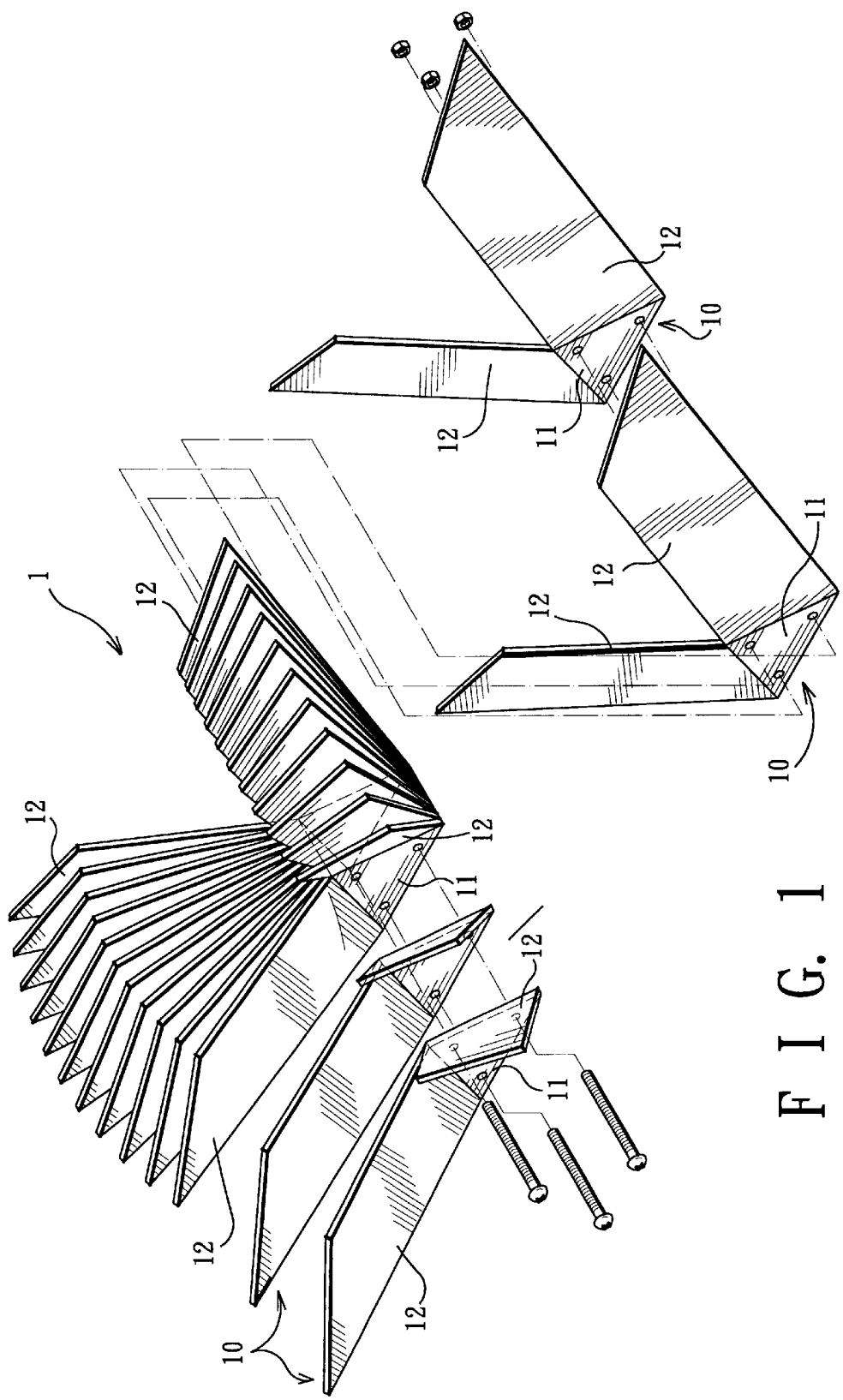
FIG. 1 is an exploded view of a preferred embodiment of the present invention.
Figure 2:
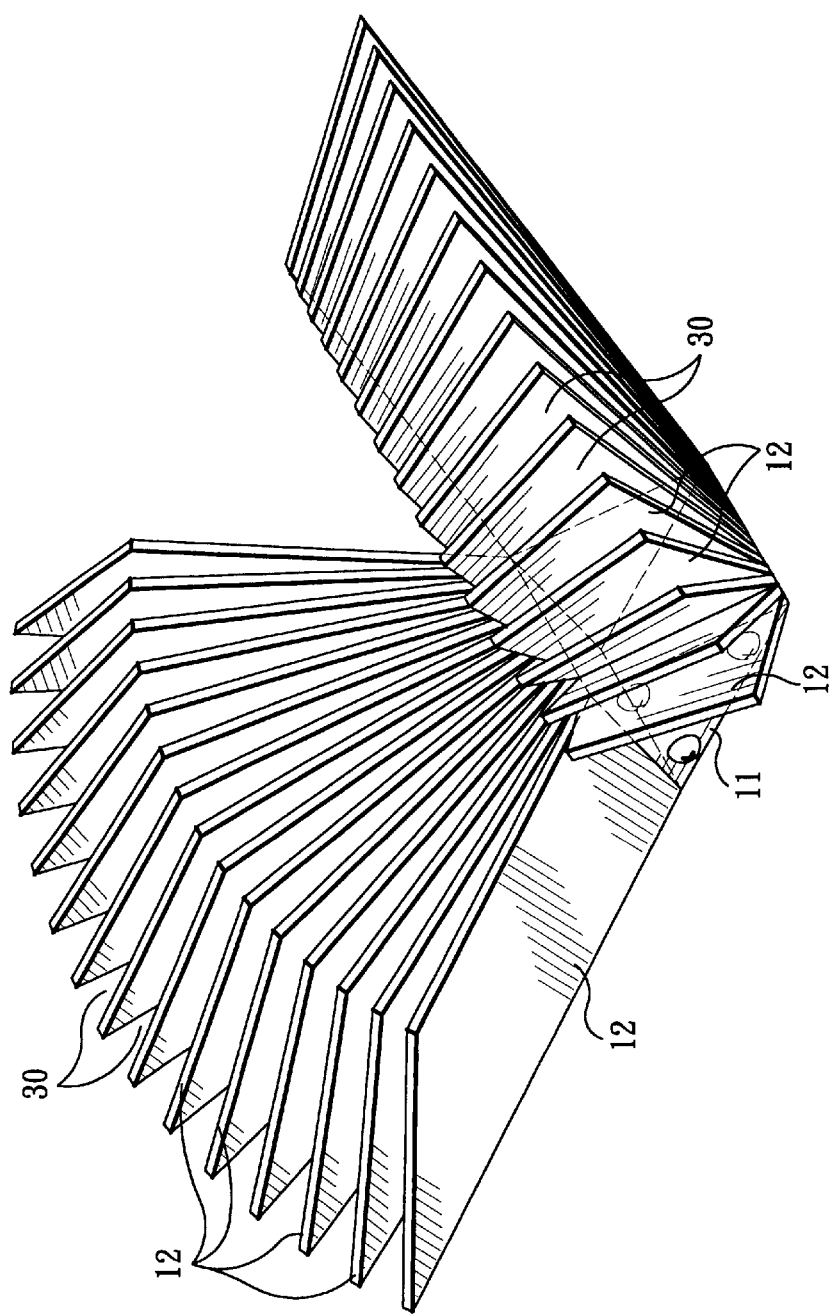
FIG. 2 is a perspective view of the preferred embodiment of FIG. 1.
Figure 3:
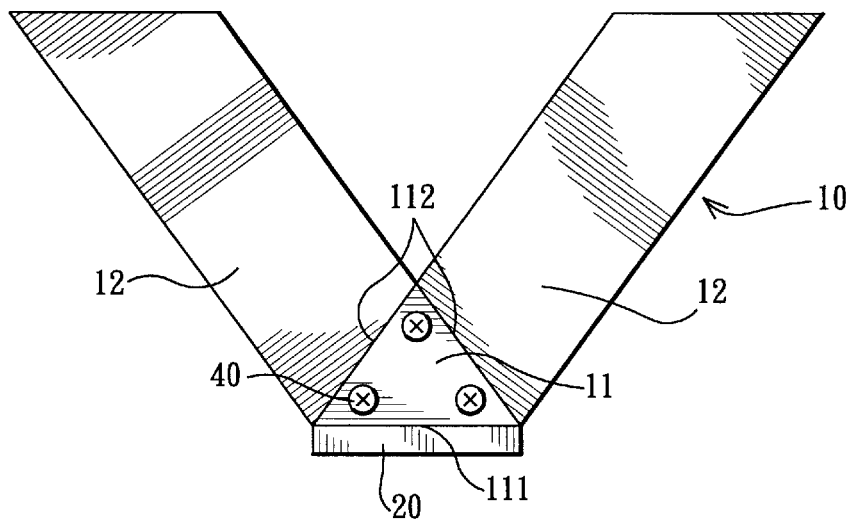
FIG. 3 is an elevation view of the preferred embodiment of FIG. 1.

Referring to FIGS. 1 to 3, a heat dissipating device 1 embodying the present invention is shown to include a plurality of plates 10 which are made of a metal, such as steel, aluminum, or the other high heat conductive metal, and which are assembled together. Each plate 10 includes a three-sided base plate portion 11 and a pair of fin plate portions 12. The base plate portion 11 has a contact side 111 adapted to contact a heat generating object 20, and two opposite sides 112 forming an angle therebetween and extending to two opposite ends of the contact side 111. The base plate portions 11 are disposed in parallel and next to each other to form a stack. Preferably, the base plate portions 11 are in the shape of an isosceles triangle and are coupled together by means of three screw fasteners 40.

Each pair of the fin plate portions 12 respectively extend outward and upward from the opposite sides 112 of the base plate portion 11 and are bent from the base plate portion 11 so as to diverge outward and to form air passages 30 therebetween. Preferably, the fin plate portions 12 are substantially trapezoidal.

Figure 4:
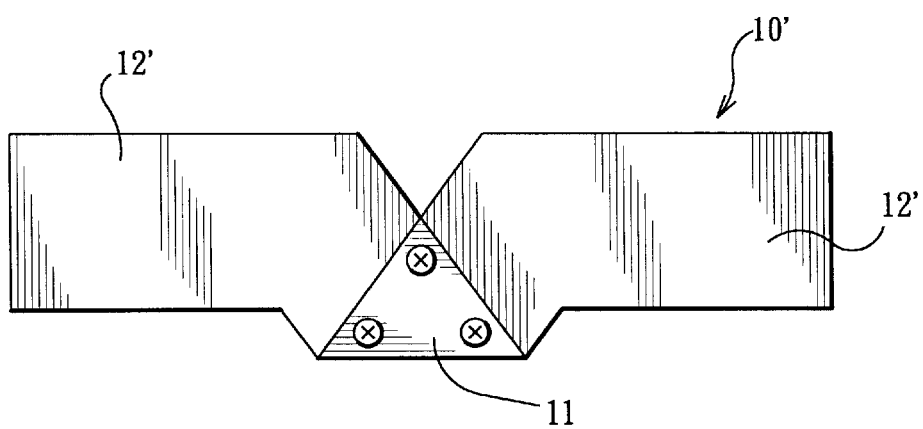
FIG. 4 is an elevation view of another preferred embodiment.

Referring to FIG. 4, another embodiment of the heat dissipating device according to the present invention includes a plurality of plates 10' each having a base plate portion 11 and two fin plate portions 12'. This embodiment differs from the previous embodiment in the shape of the fin plate portions 12' such that the overall height of the heat dissipating device thereof is reduced without decreasing the heat transfer area of the fin plate portions 12'.

In the embodiments as described above, there are two sets of the fin plate portions 12, 12' respectively extending from two opposite sides of the stack of the triangular base plate portions 11 so that a large spacing is provided between the two sets of fin plate portions 12, 12' above the base plate portions 11 to permit air to flow freely into and out of the air passages 30 defined by the fin plate portions 12, 12'. Therefore, an efficient heat transfer from the fin portions 12, 12' to air can be achieved. As compared with the four-sided base plate portions disclosed in the copending application described hereinbefore, the area of the triangular base plate portions 11 in the present invention can be reduced at least by an amount equal to half the surface area of the four-sided base plate portions having the same contact length with a heat generating device, because a triangle is half the area of a rectangle. Accordingly, for the same total weight, the ratio of the area of the fin plate portions 12, 12' to the area of the base plate portions 11 is relatively high as compared to that in the copending application. In other words, for a constant weight of the heat dissipating device, the ratio of the area of the fin plate portions to the area of the base plate portions can be maximized in the present invention. The reduction of the area of the base plate portions 11 as such decreases the size of the stack part of the heat dissipating device, but does not reduce the contact area of the heat dissipating device available for contacting a heat generating object. As the stack part of the heat dissipating device according to the present invention is compact, the problem of heat retention encountered with the conventional heat dissipating device due to a bulky stack part can be alleviated or even eliminated.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat dissipating device comprising:

a plurality of plates each having a three-sided base plate portion and a pair of fin plate portions, said base plate portion having a contact side adapted to contact a heat generating object, and two opposite sides forming an angle therebetween and extending to two opposite ends of said contact side, said base plate portions of said plates being disposed in parallel and next to each other to form a stack, said fin plate portions respectively extending outward from said opposite sides of said base plate portion, said fin plate portions of said plates being bent respectively from said base plate portions of said plates to diverge outward and to form air passages therebetween, wherein said base plate portion further having an apex higher than and opposite to said contact side, said fin plate portions extending upward from said base plate portion along a direction substantially parallel to said base plate portion to a level higher than said apex so as to increase the height of said fin plate portions along said direction.

2. The heat dissipating device according to claim 1, wherein said fin plate portions are substantially trapezoidal.

3. The heat dissipating device according to claim 2, wherein said base plate portion is an isosceles triangle.

4. The heat dissipating apparatus according to claim 1, further comprising fasteners for fastening together said base plate portions of said plates.

5. The heat dissipating device according to claim 1, wherein each of said fin plate portions has a bottom end extending at a level above said contact side.

* * * * *